United States Patent
Kobayashi et al.

(10) Patent No.: US 6,198,169 B1
(45) Date of Patent: Mar. 6, 2001

(54) SEMICONDUCTOR DEVICE AND PROCESS FOR PRODUCING SAME

(75) Inventors: Syoichi Kobayashi; Naoyuki Koizumi; Osamu Uehara; Hajime Iizuka, all of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/464,232

(22) Filed: Dec. 15, 1999

(30) Foreign Application Priority Data

Dec. 17, 1998  (JP) .................................. 10-359229

(51) Int. Cl.$^7$ .................................. H01L 23/48
(52) U.S. Cl. .................. 257/780; 257/779; 257/737; 257/738
(58) Field of Search .................. 257/779, 780, 257/737, 738

(56) References Cited

U.S. PATENT DOCUMENTS

| | | | |
|---|---|---|---|
| 5,656,863 | * 8/1997 | Yasunaga et al. | 257/778 |
| 5,757,078 | * 5/1998 | Matsuda et al. | 257/737 |
| 5,847,458 | * 12/1998 | Nakamura et al. | 257/738 |

FOREIGN PATENT DOCUMENTS

| | | |
|---|---|---|
| 0853337A1 | 7/1998 | (EP) . |
| 5-55278 | 3/1993 | (JP) . |
| 8-288293 | 11/1996 | (JP) . |
| 10-79362 | 3/1998 | (JP) . |

* cited by examiner

*Primary Examiner*—David Hardy
*Assistant Examiner*—Lourdes Cruz
(74) *Attorney, Agent, or Firm*—Pennie & Edmonds LLP (57) ABSTRACT

A semiconductor device excellent in bonding strength of bumps with respective protruded electrodes and having high reliability wherein a wiring pattern 28 to be connected to an electrode 22 of a semiconductor chip 20 is formed on an insulting film 23 formed on the semiconductor chip 20 in which the electrode 20 is formed, protruded electrodes 32 are formed on the wiring pattern 28, the wiring pattern 28 is covered with a protective film 36, and a bump 38 for external connection is formed on the end portion of each of the protruded electrodes 32 exposed from the protective film 36, the bump 38 is formed in such a manner that the bump is bonded to the at least entire end face of each of the protruded electrodes 32.

14 Claims, 6 Drawing Sheets

SEMICONDUCTOR DEVICE AND PROCESS FOR PRODUCING SAME

BACKGROUND OF THE INVENTION

1. Field of the Invention

The present invention relates to a semiconductor device, having a chip-size package structure, and a process for producing the same.

2. Description of the Related Art

A process for producing semiconductor devices comprising assembling semiconductor devices in the wafering step has been developed (Japanese Unexamined Patent Publication (Kokai) No. 10-79362). The process can provide semiconductor devices each having a separate chip-size package structure completed by cutting, and reduce the production costs.

The production process comprises forming a wiring pattern (rewiring pattern), to be connected to electrodes of the semiconductor chip, on an insulating film formed on the semiconductor chip, forming protruded electrodes by plating the wiring pattern, forming a protective film covering the wiring pattern by compression molding, and forming a solder bump for external connection on the end portion of each of the protruded electrodes.

The step of forming a protective film comprises the following procedures.

That is, a top face and a bottom face are heated to about 175° C. A temporary film is absorbed by the top face.

A wafer on which a wiring pattern and protruded electrodes are formed is placed on the bottom face, and a sealing resin is placed on the wafer.

The resin is melted by the heat and pressure of the sealing mold to be spread over the entire wafer, and held within the mold to be cured.

The wafer is taken out of the mold, and the temporary film is peeled off.

A solder bump for external connection is formed on the end portion of each of the protruded electrodes.

However, the conventional process for producing a semiconductor device has been found to have the following problems.

That is, when the process is carried out by compression molding wherein a resin is placed on a wafer, the resin is melted by pressing the resin with a mold, and the molten resin is spread over the entire wafer to form a protective film, the protective film is also placed on the end face of each of the protruded electrodes, and removal of the protective film from the end face becomes incomplete.

Figure 16:
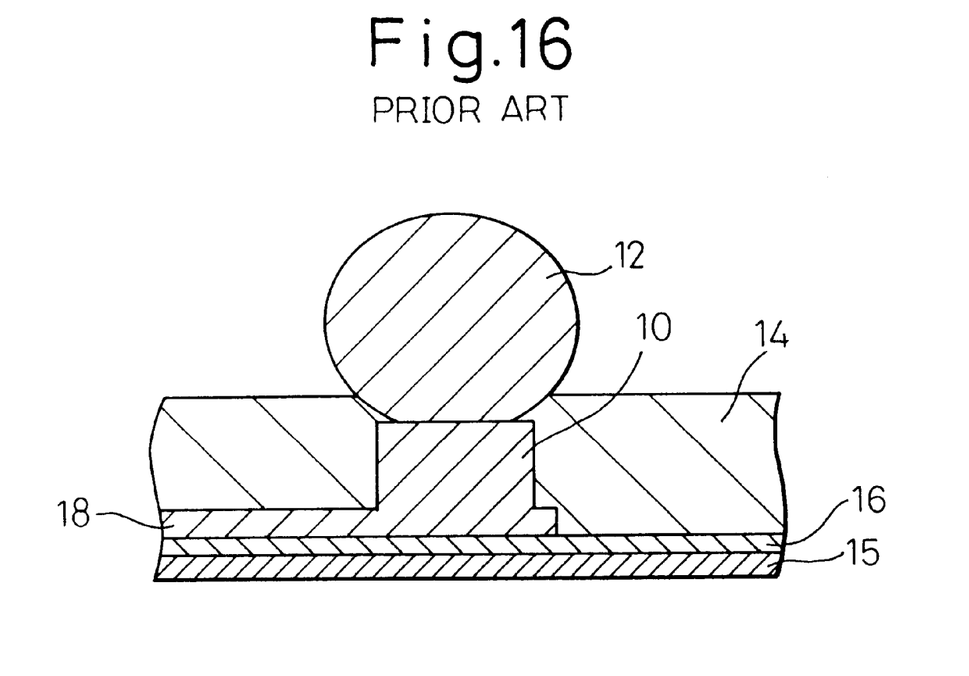
FIG. 16 is a sectional view showing a bump in the prior art.

Accordingly, when a solder bump 12 is bonded to the end portion of a protruded electrode 10 as shown in FIG. 16, the bond area of the solder bump 12 is reduced by a protective film 14, and the bond strength becomes insufficient, which causes a problem in reliability.

Moreover, the bonded portion of the solder bump 12 makes an acute angle with the surface of the protruded electrode 12, which causes the problem that the bump tends to be easily removed by impact.

In addition, the reference numerals 15, 16 and 18 designate a semiconductor chip, an insulating film formed from a polyimide resin and a rewiring pattern formed on the insulating film 16, respectively.

SUMMARY OF THE INVENTION

An object of the present invention is to provide a semiconductor device which is excellent in the bond strength of a bump with each of the protruded electrodes and which is highly reliable, and a process for producing the same.

In a semiconductor device according to the present invention wherein a wiring pattern to be connected to an electrode of a semiconductor chip is formed on an insulating film formed on the semiconductor chip surface on which the electrode is formed, protruded electrodes are formed on the wiring pattern, the wiring pattern is covered with a protective film, and a bump for external connection is formed on the end portion of each of the protruded electrodes exposed from the protective film, the bump is formed by bonding the bump to the at least entire end face of each of the protruded electrodes.

Since the bump is bonded to the entire end face of each of the protruded electrodes as described above, the bump is excellent in bond strength.

The bump mentioned above is characterized in that a barrier plated layer is formed on the end face of each of the protruded electrodes, and that the bump is formed in such a manner that the bump is bonded to the entire barrier plated layer.

Since the bump shows good wettability with the barrier plated layer, it is bonded to the entire barrier plated layer.

The protective film is characterized in that the protective film is formed to have a top surface lower than the position at which the bump is bonded to each of the protruded electrodes.

Since the top surface of the protective film is lower than that of the protruded electrodes, the protective film is never placed on the end portion of the protruded electrodes, and the bump is bonded to the entire end face of each of the protruded electrodes.

The protruded electrodes are appropriate when an oxide film is formed on the peripheral surface of each of the protruded electrodes, and when there is a gap between the protective film and the peripheral surface of each of the protruded electrodes.

The protruded electrodes thus become independent of the protective film, and are not influenced thereby even when the coefficient of thermal expansion of the electrodes differs from that of the film. Stress concentration between the protruded electrode and the bump is therefore relaxed, and crack formation and the like, in the bump and in the protective film, can be suppressed.

Furthermore, it is also appropriate in this case to form the protective film in such a manner that the level of the protective film becomes higher than the position at which the bump is bonded to each of the protruded electrodes, and that part of the peripheral surface of the bump is contacted with the protective film.

As a result, a gap between each of the electrodes and the protective film can be closed, and invasion of moisture, etc. can be prevented.

Next, in a process for producing a semiconductor device according to the present invention wherein a wiring pattern to be connected to an electrode of a semiconductor chip is formed on an insulating film formed on the semiconductor chip surface on which the electrode is formed, protruded electrodes are formed on the wiring pattern, the wiring pattern is covered with a protective film, and a bump for external connection is formed on the end portion of each of the protruded electrodes exposed from the protective film, the process comprises the steps of: covering the wiring pattern formed on the insulating film with a resist layer, and forming holes in the resist layer to expose part of the wiring pattern; plating the wiring pattern within the holes to form the protruded electrodes; removing the resist layer; effecting sealing by supplying a resin to the wiring pattern to form a resin layer having a top surface lower than that of the protruded electrodes, thereby forming a protective film; and forming a bump on each of the protruded electrodes in such a manner that the bump is bonded to the at least entire end face of each of the protruded electrodes.

Since the protective film is formed by potting or spin coating to have a top surface lower than that of each of the protruded electrodes, the entire end face of each of the protruded electrodes is exposed, and a bump is bonded to the entire end face, which improves the bond strength of the bump.

Moreover, the process is appropriate when the process comprises plating to form a barrier plated layer on the end face of each of the protruded electrodes, and when the bump is formed in the bump-forming step in such a manner that the bump is bonded to the entire barrier plated layer.

Furthermore, in a process for producing a semiconductor device according to the present invention wherein a wiring pattern to be connected to an electrode of a semiconductor chip is formed on an insulating film formed on the semiconductor chip surface on which the electrode is formed, protruded electrodes are formed on the wiring pattern, the wiring pattern is covered with a protective film, and a bump for external connection is formed on the end portion of each of the protruded electrodes exposed from the protective film, the process comprises the steps of: covering the wiring pattern formed on the insulating film with a resist layer, and forming holes in the resist layer to expose part of the wiring pattern; plating the wiring pattern within the holes to form the protruded electrodes; removing the resist layer; forming the bump on each of the protruded electrodes in such a manner that the bump is bonded to the at least entire end face of each of the protruded electrodes; and effecting sealing, after forming the bump, by supplying a resin to the wiring pattern to form a protective film.

Since the protective film is formed after forming bumps, the bumps each can be formed at a desired position of the protruded electrode, and the bond strength of the bumps can be increased.

Also in this case, the process is appropriate when the process comprises the plating step of forming a barrier plated layer on the end face of each of the protruded electrodes, and when the bump is formed in the bump-forming step in such a manner that the bump is bonded to the entire barrier plated layer.

Furthermore, in a process for producing a semiconductor device according to the present invention wherein a wiring pattern to be connected to an electrode of a semiconductor chip is formed on an insulating film formed on the semiconductor chip surface on which the electrode is formed, protruded electrodes are formed on the wiring pattern, the wiring pattern is covered with a protective film, and a bump for external connection is formed on the end portion of each of the protruded electrodes exposed from the protective film, the process comprises the steps of: covering the wiring pattern formed on the insulating film with a resist layer, and forming holes in the resist layer to expose part of the wiring pattern; plating the wiring pattern within the holes to form the protruded electrodes; removing the resist layer; forming the bump on each of the protruded electrodes in such a manner that the bump is bonded to the at least entire end face of each of the protruded electrodes; forming a photosensitive resist layer to cover the wiring pattern and the protruded electrodes; and effecting photolithography by exposing to light and developing the photosensitive resist layer to form a protective film which covers the wiring pattern and to expose the protruded electrodes.

Since the protective film is formed after forming bumps also in this process, the bumps can be formed without being influenced by the protective film, and the bond strength of the bumps can be increased.

DESCRIPTION OF THE PREFERRED EMBODIMENT

Appropriate embodiments of the present invention will be explained below in detail based on the attached drawings.

Although a process for forming a rewiring pattern on a wafer is known, the process will be briefly explained by making reference to FIG. 1 to FIG. 4.

Figure 1:
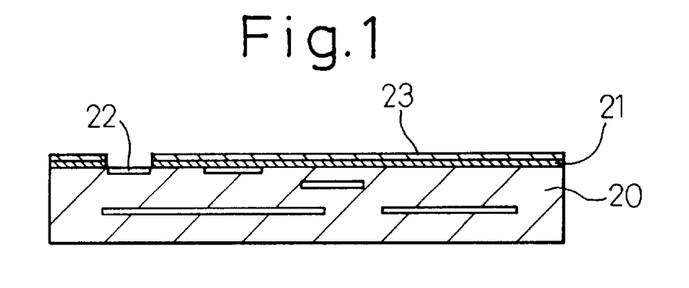
FIG. 1 is a sectional view showing the step of forming an insulating film on a wafer.

Firstly, as shown in FIG. 1, an insulating film 23 composed of a polyimide resin is formed on a passivation film 21 of a wafer (semiconductor chip) 20 except for the portion for an aluminum electrode 22.

Figure 2:
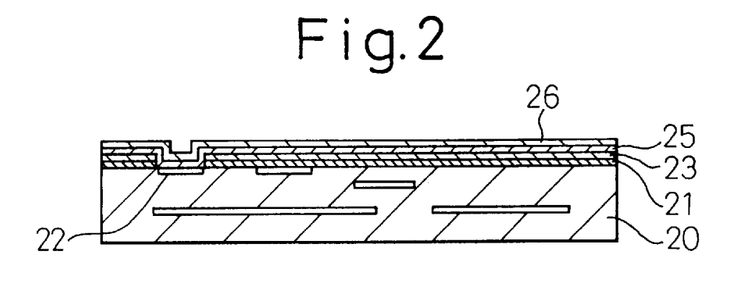
FIG. 2 is a sectional view showing the step of forming a bonded metal layer and a copper layer on an insulating film.

Secondly, as shown in FIG. 2, a bonded metal layer 25 comprising double layers of titanium and chromium and a copper layer 26 are formed by sputtering.

Figure 3:
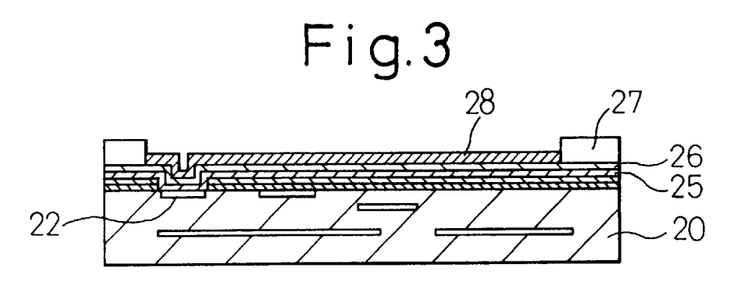
FIG. 3 is a sectional view showing the step of forming a wiring pattern.

Next, as shown in FIG. 3, a resist pattern 27 in which the copper layer 26 is exposed in a groove shape in the portion where a wiring pattern (rewiring pattern) is to be formed is formed. A plated film is formed on the copper layer 26 by electroplating of copper while the resist pattern 27 and the copper layer 26 are used as a mask and a conducting layer, respectively, thereby forming a wiring pattern 28.

The resist pattern 27 is removed.

Figure 4:
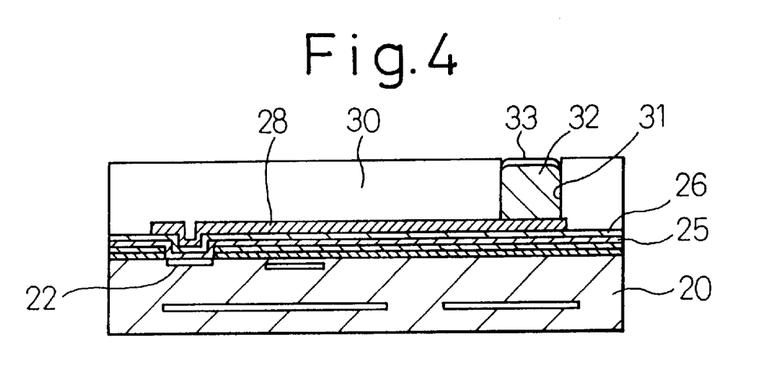
FIG. 4 is a sectional view showing the step of forming a protruded electrode.

Next, as shown in FIG. 4, a resist layer 30 is formed on the wiring pattern 28, and holes 31 are formed in the resist layer 30 to expose part of the wiring pattern 28.

The wiring pattern 28 within the holes 31 is electroplated with copper to form protruded electrodes 32.

A barrier plated layer 33 comprising a nickel coating and a gold coating is further formed on the end face of each of the protruded electrodes 32. The barrier plated layer 33 may also comprise two layer coatings formed with a nickel coating and a palladium coating.

The resist layer 30 is then removed.

The exposed copper layer 26 and the bonded metal layer 25 are removed by etching, thereby isolating the wiring pattern 28.

Figure 5:
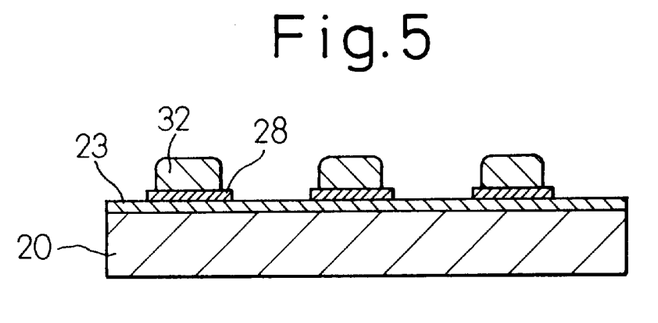
FIG. 5 is sectional view showing a wafer on which protruded electrodes are formed.

The wafer 20 on which the insulating film 23, the wiring pattern 28 and the protruded electrodes 32 have been formed can thus be obtained (FIG. 5).

First Embodiment

Figure 6:
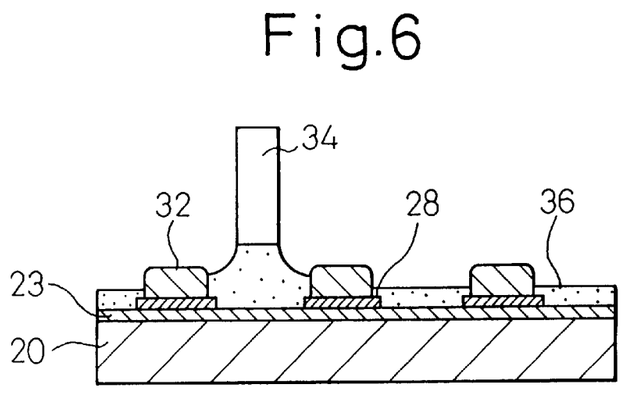
FIG. 6 is a sectional view showing the step of supplying a resin on a wafer in a first embodiment.

Next, as shown in FIG. 6, a resin composed of an epoxy resin, etc. is supplied to the wiring pattern 28 from a nozzle 34, flattened, and cured to form a protective film 36. Spin coating is suitable for flattening the resin.

The level of the protective film 36 is made lower than that of the protruded electrodes 32.

Figure 7:
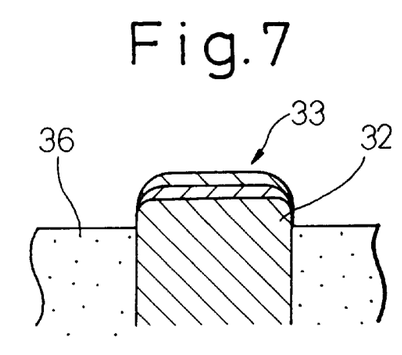
FIG. 7 is a sectional view showing the shape of a protruded electrode.

Specifically, when the protruded electrodes 32 are formed by electroplating to make a protrusion, the center of the end face of each of the electrodes becomes protuberant to some extent as shown in FIG. 7. The protective film 36 is formed in such a manner that the level of the film becomes lower than that of the edge portion of the barrier plated layer 33.

Figure 8:
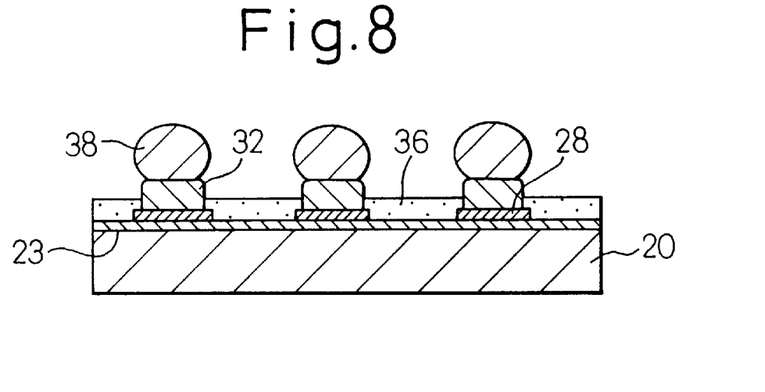
FIG. 8 is a sectional view showing bumps bonded to protruded electrodes, respectively.

A solder bump 38 is subsequently formed on each of the protruded electrodes 32 as shown in FIG. 8.

Figures 9A, 9B:
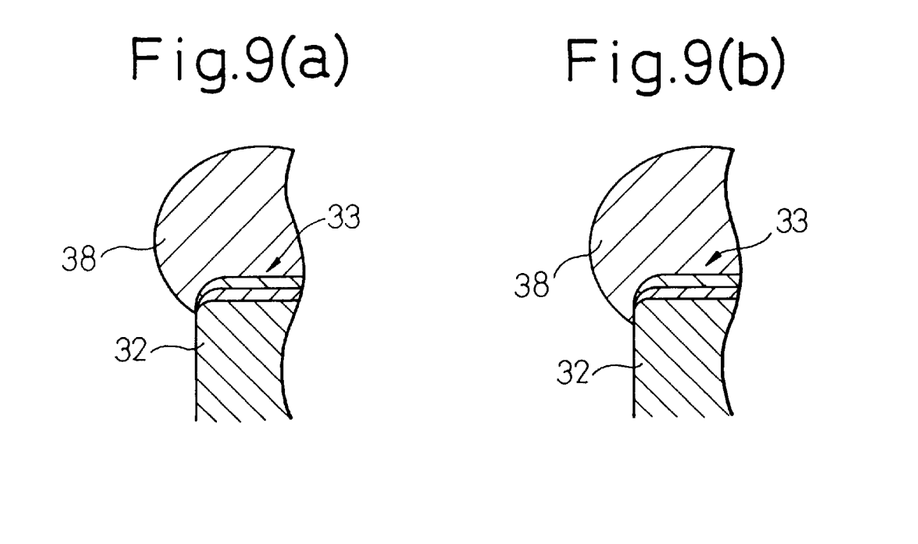
FIG. 9(a) and FIG. 9(b) are sectional views each showing the form of a bonded bump.

The solder bump 38 is formed in such a manner that the bump 38 is bonded to the entire barrier plated layer 33 having good wettability (FIG. 9(a)). That is, an oxide film is formed on the peripheral surface of the protruded electrode 32 formed with copper. Since the wettability of solder with the oxide film is poor, the solder bump 38 is formed so that the bump is bonded to the entire barrier plated layer 33. In addition, when a highly active flux is used, the oxide film on the peripheral surface of the protruded electrode 32 is sometimes removed, and the solder bump 38 adheres to the portion where the oxide film has been removed. The state is included in the state where "the bump is bonded to the entire barrier plated layer 33" in the present invention (FIG. 9(b)).

As explained above, since the bump is formed while the bump is bonded to the entire end face of the protruded electrode 32, in more detail, the bump is bonded to the entire barrier plated layer, a large bond area is obtained, and the bond strength of the bump 38 can be increased. Moreover, the bond angle made by the solder bump 38 with the protruded electrode does not become an acute angle; therefore, the solder bump is also excellent in strength on impact.

In addition, the entire end face of the protruded electrode 32 designates the entire end face included within the sectional area of the protruded electrode 32 (within the area of the plan view thereof) even when the end face forms a curved surface.

Second Embodiment

Figure 10:
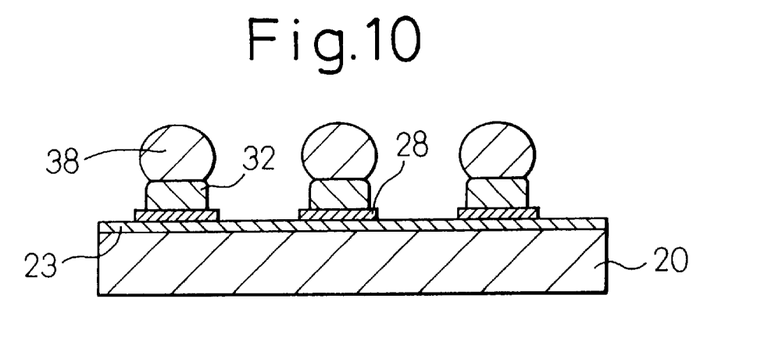
FIG. 10 is a sectional view showing bumps bonded to protruded electrodes, respectively, in a second embodiment.
Figure 11:
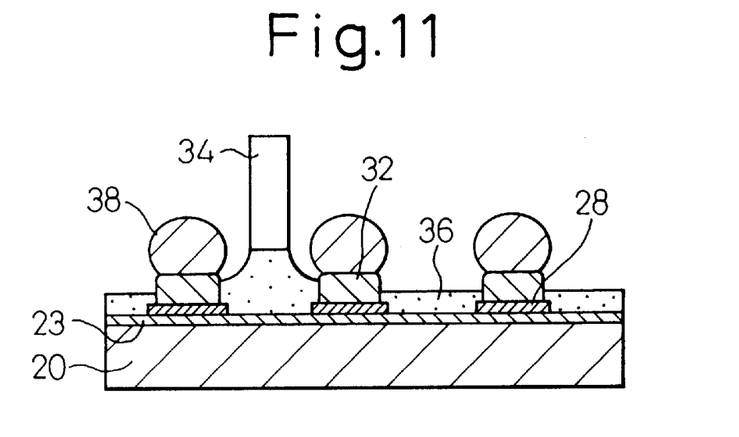
FIG. 11 is a sectional view showing the step of supplying a resin on a wafer.

FIG. 10 and FIG. 11 show a second embodiment.

In the present embodiment, the solder bumps 38 are firstly formed on the protruded electrodes 32, respectively, on the wafer 20 shown in FIG. 5, as shown in FIG. 10.

Similarly to FIG. 9, also in this case, since an oxide film is formed on the peripheral surface of each of the protruded electrodes 32, the protruded electrodes show poor wettability with solder; therefore, the solder bumps 38 are each determined to be bonded to the entire barrier plated layer 33.

Next, as shown in FIG. 11, a resin such as an epoxy resin is supplied from a nozzle 34 to the wiring pattern 28, and cured to form a protective film 36.

The level of the protective film 36 is arbitrary in this case. That is, since each of the bumps 38 has already been bonded to the protruded electrode 32 to form a necessary bond area, the bond strength of the bumps 38 is not influenced by the protective film 38.

Third Embodiment

Figure 12:
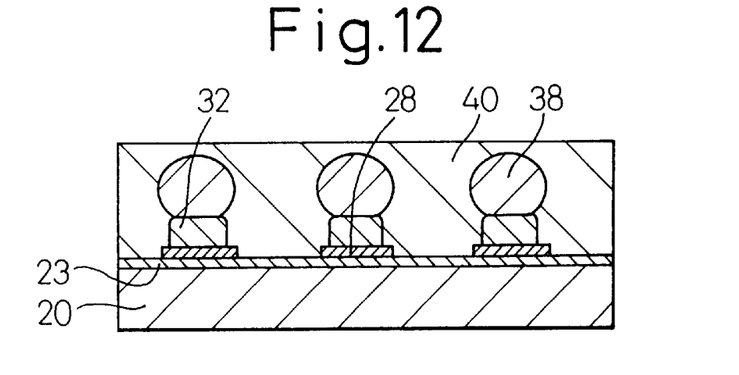
FIG. 12 is a sectional view showing the step of forming a photosensitive resist layer in a third embodiment.

In the present embodiment, the solder bumps 38 are formed on the protruded electrodes 32, respectively, as shown in FIG. 10 for the second embodiment, and a photosensitive resist layer 40 is formed to cover the wiring pattern 28 and even the top of the solder bumps 38 as shown in FIG. 12.

Figure 13:
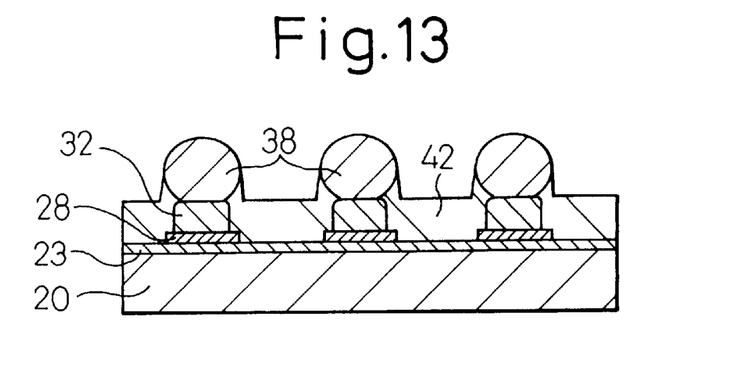
FIG. 13 is a sectional view showing the step of forming a protective film with a photosensitive resist layer.

Next, as shown in FIG. 13, the photosensitive resist layer 40 is exposed and developed by photolithography to form a protective film 42 which covers the wiring pattern 28 and to disclose the protruded electrodes 32.

A positive photosensitive resist is used for the photosensitive resist layer 40. Control of the exposure time can control the depth of exposure, and as a result the thickness of the resist layer, which can be removed by etching, can be controlled.

Furthermore, since the light does not impinge on a portion near the root of each of the solder bumps 38, the resist layer covering the periphery of the bond portion between each of the solder bumps 38 and the corresponding protruded electrode 32 can be left as shown in FIG. 13, whereby the bond portion can be protected.

The bond strength of the solder bumps 38 can be increased also in the present embodiment.

In each of the embodiments mentioned above, each of the semiconductor devices can of course be completed separately by finally cutting the wafer 20.

In addition, semiconductor devices can each be completed separately by cutting the wafer first to give separate semiconductor chips, and then following the steps as mentioned above.

Figure 14:
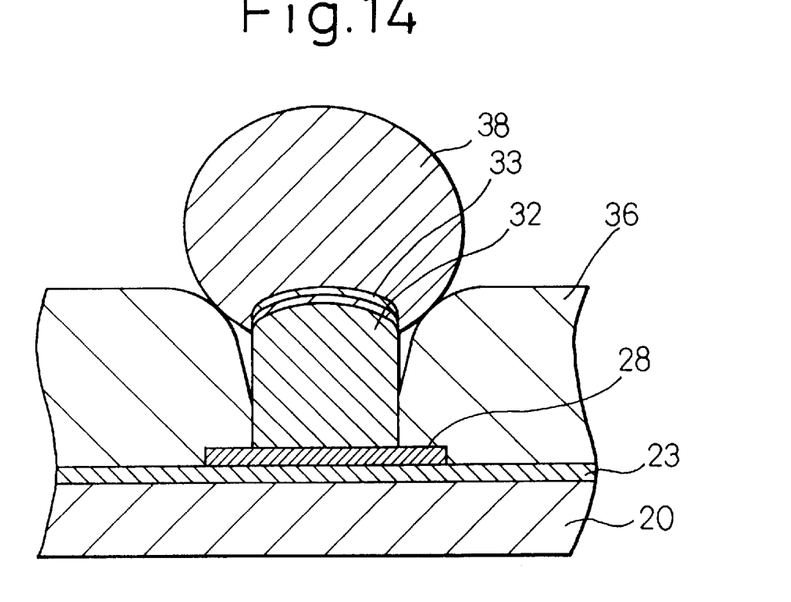
FIG. 14 is a sectional view showing a gap formed between a protective film and a protruded electrode.

In the second embodiment, as shown in FIG. 14, a gap (structure without adhesion) can be formed between the protective film 36 and the peripheral surface of the protruded electrode 32, depending on the type of resin used.

That is, as explained above, an oxide film is formed on the peripheral surface of the protruded electrode 32, and some resins show poor wettability with the protruded electrode when the oxide film is formed. As a result, the protective film 36 does not adhere to the peripheral surface of the protruded electrode 32.

An oxide film may also be positively formed on the peripheral surface of the protruded electrode 32.

Consequently, the protruded electrode 32 becomes independent of the protective film 36, and is not influenced thereby even when the coefficient of thermal expansion of the electrode differs from that of the film. Stress concentration in the bond portion between the protruded electrode 32 and the bump 38 is relaxed, and crack formation, and the like, in the bond portion can be suppressed.

Also in this case, it is appropriate to form the protective film 36 in such a manner that its level becomes higher than the position at which the bump 38 is bonded to the protruded electrode 32, and that part of the peripheral surface of the bump is contacted with the protective film 36 (FIG. 14).

As a result, the gap between the protruded electrode 32 and the protective film 36 can be closed, and invasion of moisture, and the like, can be prevented.

Figure 15:
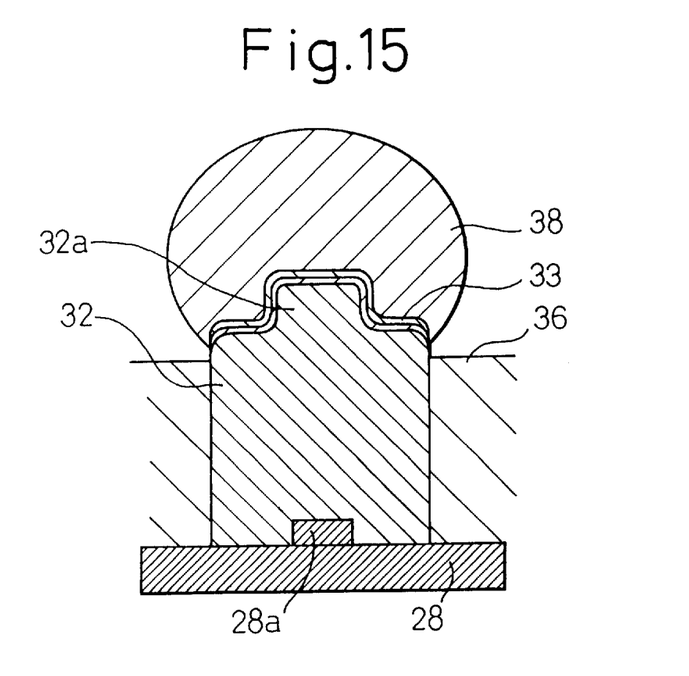
FIG. 15 is a sectional view showing a protrusion formed at the end of a protruded electrode.

FIG. 15 shows another embodiment of the end face shape of the protruded electrode 32.

In the present embodiment, the end face central portion of the protruded electrode 32 has a still more protuberant shape (protruded portion 32 a).

In order to form such a protruded portion 32 a, the following procedure is recommended. A split 28 a is adhered to the wiring pattern 28 when the protruded electrode 32 is to be formed by plating, and the protruded electrode 32 is formed on the wiring pattern 28 including the slip 28 a by plating. Since the plated coating is formed to have an approximately uniform thickness, the protruded portion 32 a corresponding to the split 28 can be formed.

The split 28 a can be formed by plating during the step of forming the wiring pattern 28.

Formation of such a protruded portion 32a can increase the end face area of the protruded electrode 32, which further increases the bond strength of the bump 38.

The present invention has been explained above in various ways by making reference to appropriate embodiments. However, the present invention is not restricted to the embodiments, and many modifications of the present invention are naturally possible so long as the modifications do not depart from the spirit and the scope of the invention.

According to the semiconductor device and the production process of the present invention, a semiconductor device excellent in the bond strength of the bumps can be provided.

What is claimed is:

1. A semiconductor device wherein a wiring pattern connected to an electrode of a semiconductor chip is formed on an insulating film formed on the semiconductor chip surface on which the electrode is formed, protruded electrodes are formed on the wiring pattern by plating, with each of the protruded electrodes terminating at an end face, the wiring pattern is covered with a protective film, a barrier plated layer is formed on the entire end face of each of the protruded electrodes, and a solder bump for external connection is provided on the entire barrier plated layer on the end face of each of the protruded electrodes, the solder bump being bonded to the entire barrier plated layer on the end face of each of the protruded electrodes.

2. The semiconductor device according to claim 1, wherein a barrier plated layer is formed on the end face of each of the protruded electrodes, and the bump is formed in such a manner that the bump is bonded to the entire barrier plated layer.

3. The semiconductor device according to claim 1, wherein the protective film has a top surface positioned lower than the solder bump.

4. The semiconductor device according to claim 1, wherein each of the protruded electrodes includes a peripheral surface, an oxide film is formed on the peripheral surface of each of the protruded electrodes, and a gap is provided between the protective film and the peripheral surface of each of the protruded electrodes.

5. The semiconductor device according to claim 4, wherein the protective film has a top surface which contacts the bump.

6. The semiconductor device according to claim 1, wherein the protruded electrodes are made of copper.

7. A semiconductor device comprising: a semiconductor chip; an insulating film provided on a surface of the semiconductor chip; a wiring pattern provided on the insulating film and connected to an electrode of the semiconductor chip; protruded electrodes provided on the wiring pattern, with each electrode terminating at an end face; a protective film covering the wiring pattern; a barrier plated layer provided on the entire end face of each of the protruded electrodes; and a solder bump for external connection provided on the entire barrier plated layer of each end face of each protruded electrode.

8. The semiconductor device according to claim 7, wherein the protective film has a top surface positioned lower than the bump.

9. The semiconductor device according to claim 7, wherein each protruded electrode includes a peripheral surface, an oxide film is formed on the peripheral surface of each protruded electrode, and a gap is provided between the protective film and the peripheral surface of each protruded electrode.

10. The semiconductor device according to claim 9, wherein the protective film has a top surface which contacts the bump.

11. The semiconductor device according to claim 7, wherein the protruded electrodes are made of copper.

12. A semiconductor device wherein a wiring pattern connected to an electrode of a semiconductor chip is formed on an insulating film formed on the semiconductor chip surface on which the electrode is formed, protruded electrodes are formed on the wiring pattern with each protruded electrode includes a peripheral surface and terminates at an end face, the wiring pattern is covered with a protective film, a solder bump for external connection, the solder bump being bonded to the entire end face of each protruded electrode, an oxide film is formed on the peripheral surface of each protruded electrode, and a gap is provided between the protective film and the peripheral surface of each protruded electrode.

13. The semiconductor device according to claim 12, wherein the protective film has a top surface which contacts the bump.

14. The semiconductor device according to claim 12, wherein the protruded electrodes are made of copper.

* * * * *